United States Patent
Hwang et al.

(10) Patent No.: US 10,395,324 B2
(45) Date of Patent: Aug. 27, 2019

(54) METHOD AND APPARATUS FOR CALCULATING BASIC ELECTRICITY CHARGES FOR PARTITIONED OWNERS IN AGGREGATE BUILDING

(71) Applicant: Electronics and Telecommunications Research Institute, Daejeon (KR)

(72) Inventors: Tae In Hwang, Daejeon (KR); Il Woo Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 863 days.

(21) Appl. No.: 14/923,549

(22) Filed: Oct. 27, 2015

(65) Prior Publication Data
US 2016/0117784 A1   Apr. 28, 2016

(30) Foreign Application Priority Data

Oct. 27, 2014 (KR) .................. 10-2014-0146294
Sep. 3, 2015 (KR) .................. 10-2015-0124830

(51) Int. Cl.
*G06Q 50/06* (2012.01)
*G06Q 30/02* (2012.01)
*G01R 21/133* (2006.01)

(52) U.S. Cl.
CPC .......... *G06Q 50/06* (2013.01); *G06Q 30/0283* (2013.01); *G01R 21/133* (2013.01); *Y04S 50/14* (2013.01)

(58) Field of Classification Search
CPC .. G06Q 50/06; G06Q 30/0283; G01R 21/133; Y04S 50/14
(Continued)

(56) References Cited

U.S. PATENT DOCUMENTS 6,021,401 A * 2/2000 Oravetz ................. G06Q 50/06
                                                         702/61
2006/0241880 A1* 10/2006 Forth ..................... G01R 22/10
                                                         702/60
(Continued)

FOREIGN PATENT DOCUMENTS

KR          100812653 B1    3/2008
KR       1020100037430 A    4/2010
(Continued)

OTHER PUBLICATIONS

"Guide to the Implementation of Tenant Submetering and Billing for Commercial Buildings in Northern California"; The Building Owners and Managers Association of California; May 2008; available at: http://bomacal.org/wp-content/uploads/2012/01/BOMA-Submetering-Guide-Northern-California04_07_08.pdf(Year: 2008).*
(Continued)

*Primary Examiner* — Kevin H Flynn
*Assistant Examiner* — Emmett K. Walsh
(74) *Attorney, Agent, or Firm* — William Park & Associates Ltd.

(57) ABSTRACT

The present invention related to an apparatus and a method for calculating basic electricity charges, being capable of periodically collecting electricity usage information for each household by using a smart meter provided in an aggregate building in which power reception equipment is installed, calculating the monthly or yearly maximum demand power for each household using the collected electricity usage information, and then, automatically calculating the basic electricity charges for each household with respect to the basic electricity charges of an entire aggregate building in consideration of the calculated maximum demand power for each household obtained and a ratio of ownership shares for each household based on the ownership shares for each resident household.

11 Claims, 4 Drawing Sheets

(58) Field of Classification Search
USPC .......................................................... 705/412
See application file for complete search history.

(56) References Cited

U.S. PATENT DOCUMENTS

| | | |
|---|---|---|
| 2013/0088082 A1 | 4/2013 | Kang et al. |
| 2014/0206384 A1 | 7/2014 | Etri |
| 2014/0279712 A1* | 9/2014 | Ortner ................ G06Q 30/0283 |
| | | 705/412 |

FOREIGN PATENT DOCUMENTS

| | | |
|---|---|---|
| KR | 1020110057865 A | 6/2011 |
| KR | 1020140116047 A | 10/2014 |

OTHER PUBLICATIONS

"Proposal on calculating basic electricity charges for partitioned owners in an aggregate building", SG13RGM C 122, Nov. 10-21, 2014, pp. 1-4.

* cited by examiner

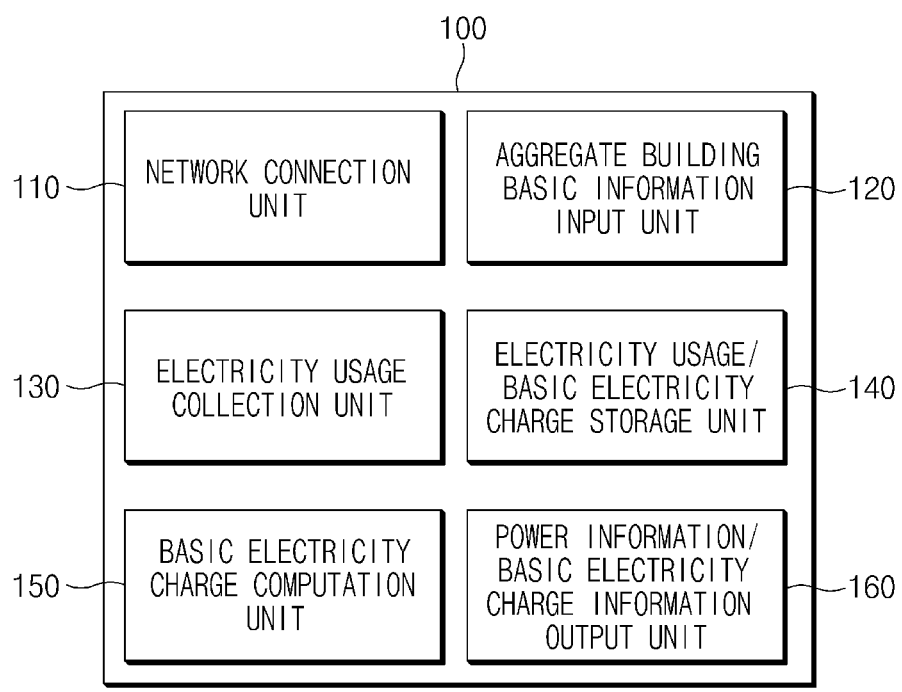
F I G. 2 even if the maximum demand power is equal to or less than 30% of the contract demand, the 30% of the contract demand may be applied to the basic electricity charge.

METHOD AND APPARATUS FOR CALCULATING BASIC ELECTRICITY CHARGES FOR PARTITIONED OWNERS IN AGGREGATE BUILDING

CROSS-REFERENCE TO RELATED APPLICATION

This application claims the benefit of priority to Korean Patent Application No. 10-2014-0146294, filed on Oct. 27, 2014 and Korean Patent Application No. 10-2015-0124830, filed on Sep. 3, 2015 in the Korean Intellectual Property Office, the disclosure of which is incorporated herein in its entirety by reference.

BACKGROUND OF THE INVENTION

Field of the Invention

The present invention relates to an apparatus and a method for calculating basic electricity charges, and more particularly, to an apparatus and a method for automatically calculating basic electricity charges for partitioned owners using a maximum demand power for each resident household obtained based on electricity usage information for each resident household in an aggregate building and a ratio of ownership shares for each household based on the ownership shares for each resident household.

Description of the Related Art

The existing electricity charges of an aggregate building may be mainly divided into a basic electricity charge and an electricity usage charge. The electricity supply companies may charge the basic electricity charge and the electricity usage charge for the entire aggregate building, and a building management company may calculate the basic electricity charge and the electricity usage charge for each resident household in the aggregate building and impose the calculated charge on users. The electricity usage charge for each resident household may be read by a smart meter installed in each household and the electricity usage charge may be calculated in proportion to the electricity usage for each household. However, in the case of the basic electricity charge, there are various charging methods for each aggregate building. Accordingly, there may be a conflict among resident households due to the unreasonable basic electricity charge for each household. In the case of the domestic basic electricity charge, a maximum demand power which is the largest power among the powers of immediately preceding 12 months including the latest month of reading meter may be applied to an yearly basic electricity charge. For example, the Korea Electric Power Corporation may apply the maximum demand power which is the largest power among the powers of immediately preceding 12 months including the latest month of reading meter, particularly, among June, July, August, December, January, February, and the latest month of reading meter, to the yearly basic electricity charge. Even if the maximum demand power is equal to or less than 30% of the contract demand, the 30% of the contract demand may be applied to the basic electricity charge.

In the same manner, the basic electricity charge for the entire aggregate building may be imposed. However, the basic electricity charge for each resident household in the entire aggregate building may be imposed based on a ratio of ownership shares for each household, or may be imposed by simultaneously applying the ratio of ownership shares and a ratio of electricity usage.

However, when the basic electricity charge is imposed according to the ratio of ownership shares, a household, which has a large ownership shares but has a small amount of electricity usage, may have complaints, whereas it may occur that a resident having small ownership shares should pay a lot of the basic electricity charge although the maximum demand power which can be consumed instantaneously is not so large.

SUMMARY OF THE INVENTION

The present invention has been made in view of the above problems, and provides an apparatus and a method for automatically calculating basic electricity charges capable of periodically collecting electricity usage information for each household by using a smart meter provided in an aggregate building in which power reception equipment is installed, calculating the monthly or yearly maximum demand power for each household using the collected electricity usage information, and then, automatically calculating the basic electricity charges for each household with respect to the basic electricity charges of an entire aggregate building in consideration of the calculated maximum demand power for each household obtained and a ratio of ownership shares for each household based on the ownership shares for each resident household.

The present invention further provides an apparatus and a method for calculating basic electricity charges capable of healing dissensions caused by the existing unreasonable calculation of the basic electricity charge, and inducing partitioned owners or residents of the aggregate building to minimize the power consumption by reflecting the maximum demand power for each household on the calculation of the basic electricity charge, thereby managing the use of the power so that the entire basic electricity charge of the aggregate building and the electricity charges for each household may be reduced.

In accordance with an aspect of the present invention, an apparatus for calculating basic electricity charges for partitioned owners in an aggregate building includes: a basic information input unit configured to receive a ratio of ownership shares for each household and an entire basic electricity charge of the aggregate building for an electricity charging period through a user interface; an electricity usage collection unit configured to collect information on electricity usage for each household from a smart meter for each household which measures electricity usage for each household of the aggregate building via a local network inside of the aggregate building, collect information on electricity usage for an entire aggregate building for the electricity charging period from a power meter reading system of a power company via an outside network, and store the collected information in a storage means; and a basic electricity charge computation unit configured to calculate a basic electricity charge for each household by using the information of the storage means so that a basic electricity charge for the entire aggregate building may be distributed to each household which is imposed for the electricity charging period by the power company, according to the information on electricity usage for each household and the ratio of ownership shares for each household, according to a request for calculation.

The electricity usage collection unit collects the information on electricity usage for each household which is periodically transmitted by the smart meter for each household.

The electricity usage collection unit collects the information on electricity usage for each household from the smart meter for each household by transmitting request information to the smart meter for each household in a preset time.

The apparatus for calculating basic electricity charges further comprising: a storage unit configured to calculate the largest value among average power value for each collection time slot from the information on electricity usage for each household and store the calculated largest value as a maximum demand power for each household in the storage means, wherein the basic electricity charge computation unit calculates the basic electricity charge for each household by reflecting a value obtained by distributing a basic electricity charge of an integrated household to each household according to a ratio of a total sum of the maximum demand power for each household to the maximum demand power for each household, based on the information on electricity usage for each household.

The basic electricity charge computation unit calculates the basic electricity charge for each household by reflecting a value obtained by distributing a basic electricity charge of an integrated household to each household according to a ratio of an electricity usage of integrated household to an electricity usage for each household, based on the information on electricity usage for each household.

The basic electricity charge computation unit calculates the basic electricity charge for each household by reflecting a value obtained by distributing a common basic electricity charge to each household according to a ratio of a total sum of the ratio of ownership shares for each household to the ratio of ownership shares for each household, based on the ratio of ownership shares for each household.

The basic electricity charge computation unit computes a common basic electricity charge of aggregate building according to a difference between the electricity usage for the entire aggregate building and an electricity usage of integrated household, computes a basic electricity charge of integrated household by deducting a common basic electricity charge computed from the basic electricity charge of the entire aggregate building according to a ratio of the electricity usage for the entire aggregate building to a common electricity usage, from the basic electricity charge of the entire aggregate building, and calculates the basic electricity charge for each household by reflecting a value obtained by distributing the basic electricity charge of integrated household to each household.

The basic electricity charge computation unit calculates the basic electricity charge for each household by summing up a value obtained by distributing the basic electricity charge of the integrated household to each household according to a ratio of a total sum of the maximum demand power for each household to the maximum demand power for each household, and a value obtained by distributing the common basic electricity charge to each household according to a ratio of a total sum of the ratio of ownership shares for each household to the ratio of ownership shares for each household.

The basic electricity charge computation unit calculates the basic electricity charge for each household by summing up a value obtained by distributing the basic electricity charge of the integrated household to each household according to a ratio of the electricity usage of integrated household to the electricity usage for each household, and a value obtained by distributing the common basic electricity charge to each household according to a ratio of a total sum of the ratio of ownership shares for each household to the ratio of ownership shares for each household.

In accordance with another aspect of the present invention, a method for calculating basic electricity charges for partitioned owners in an aggregate building, includes: receiving a ratio of ownership shares for each household and an entire basic electricity charge of the aggregate building for an electricity charging period through a user interface; collecting information on electricity usage for each household from a smart meter for each household which measures electricity usage for each household of the aggregate building via a local network inside of the aggregate building, collecting information on electricity usage for an entire aggregate building for the electricity charging period from a power meter reading system of a power company via an outside network, and storing the collected information in a storage means; and calculating a basic electricity charge for each household by using the information of the storage means so that a basic electricity charge for the entire aggregate building may be distributed to each household which is imposed for the electricity charging period by the power company, according to the information on electricity usage for each household and the ratio of ownership shares for each household, according to a request for calculation.

Collecting information on electricity usage for each household comprises collecting the information on electricity usage for each household which is periodically transmitted by the smart meter for each household.

Collecting information on electricity usage for each household comprises collecting the information on electricity usage for each household from the smart meter for each household by transmitting request information to the smart meter for each household in a preset time.

The method further includes calculating the largest value among average power value for each collection time slot from the information on electricity usage for each household and storing the calculated largest value as a maximum demand power for each household in the storage means, wherein calculating a basic electricity charge for each household comprises calculating the basic electricity charge for each household by reflecting a value obtained by distributing a basic electricity charge of an integrated household to each household according to a ratio of a total sum of the maximum demand power for each household to the maximum demand power for each household, based on the information on electricity usage for each household.

Calculating a basic electricity charge for each household comprises calculating the basic electricity charge for each household by reflecting a value obtained by distributing a basic electricity charge of an integrated household to each household according to a ratio of an electricity usage of integrated household to an electricity usage for each household, based on the information on electricity usage for each household.

Calculating a basic electricity charge for each household comprises calculating the basic electricity charge for each household by reflecting a value obtained by distributing a common basic electricity charge to each household according to a ratio of a total sum of the ratio of ownership shares for each household to the ratio of ownership shares for each household, based on the ratio of ownership shares for each household.

Calculating a basic electricity charge for each household comprises computing a common basic electricity charge of aggregate building according to a difference between the electricity usage for the entire aggregate building and an electricity usage of integrated household; computing a basic electricity charge of integrated household by deducting a common basic electricity charge computed from the basic electricity charge of the entire aggregate building according to a ratio of the electricity usage for the entire aggregate building to a common electricity usage, from the basic electricity charge of the entire aggregate building; and calculating the basic electricity charge for each household by reflecting a value obtained by distributing the basic electricity charge of integrated household to each household.

Calculating a basic electricity charge for each household comprises calculating the basic electricity charge for each household by summing up a value obtained by distributing the basic electricity charge of the integrated household to each household according to a ratio of a total sum of the maximum demand power for each household to the maximum demand power for each household, and a value obtained by distributing the common basic electricity charge to each household according to a ratio of a total sum of the ratio of ownership shares for each household to the ratio of ownership shares for each household.

Calculating a basic electricity charge for each household comprises calculating the basic electricity charge for each household by summing up a value obtained by distributing the basic electricity charge of the integrated household to each household according to a ratio of the electricity usage of integrated household to the electricity usage for each household, and a value obtained by distributing the common basic electricity charge to each household according to a ratio of a total sum of the ratio of ownership shares for each household to the ratio of ownership shares for each household.

In accordance with another aspect of the present invention, a system for calculating basic electricity charges in an aggregate building in association with a power meter reading system of a power company on a network includes: a smart meter of a power company configured to provide information on electricity usage for an entire aggregate building for an electricity charging period to the power meter reading system of the power company; a smart meter for each household configured to measure electricity usage consumed in each household of the aggregate building and periodically provide information on electricity usage for each household; and an apparatus for calculating basic electricity charges in an aggregate building configured to collect the information on electricity usage for each household via a local network inside of the aggregate building, collect information on electricity usage for an entire aggregate building for the electricity charging period from the power meter reading system of the power company via an outside network, and store the collected information in a storage means, wherein the apparatus for calculating basic electricity charges in an aggregate building receives a ratio of ownership shares for each household and an entire basic electricity charge of the aggregate building for the electricity charging period through a user interface, and calculates a basic electricity charge for each household by using the information of the storage means so that a basic electricity charge for the entire aggregate building may be distributed to each household, according to the information on electricity usage for each household and a ratio of ownership shares for each household, according to a request for calculation.

The apparatus and the method for automatically calculating basic electricity charges according to the present invention are capable of periodically collecting electricity usage information for each household by using a smart meter provided in an aggregate building in which power reception equipment is installed, calculating the monthly or yearly maximum demand power for each household using the collected electricity usage information, and then, automatically calculating the basic electricity charges for each household with respect to the basic electricity charges of an entire aggregate building in consideration of the calculated maximum demand power for each household obtained and a ratio of ownership shares for each household based on the ownership shares for each resident household, and healing dissensions caused by the existing unreasonable calculation of the basic electricity charge, and inducing partitioned owners or residents of the aggregate building to minimize the power consumption by reflecting the maximum demand power for each household on the calculation of the basic electricity charge, thereby managing the use of the power so that the entire basic electricity charge of the aggregate building and the electricity charges for each household may be reduced.

BRIEF DESCRIPTION OF THE DRAWINGS

The objects, features and advantages of the present invention will be more apparent from the following detailed description in conjunction with the accompanying drawings, in which:

FIG. 2 is a block diagram illustrating an apparatus for calculating the basic electricity charge of an aggregate building according to an embodiment of the present invention;

DETAILED DESCRIPTION OF EXEMPLARY EMBODIMENTS

Figure 1:
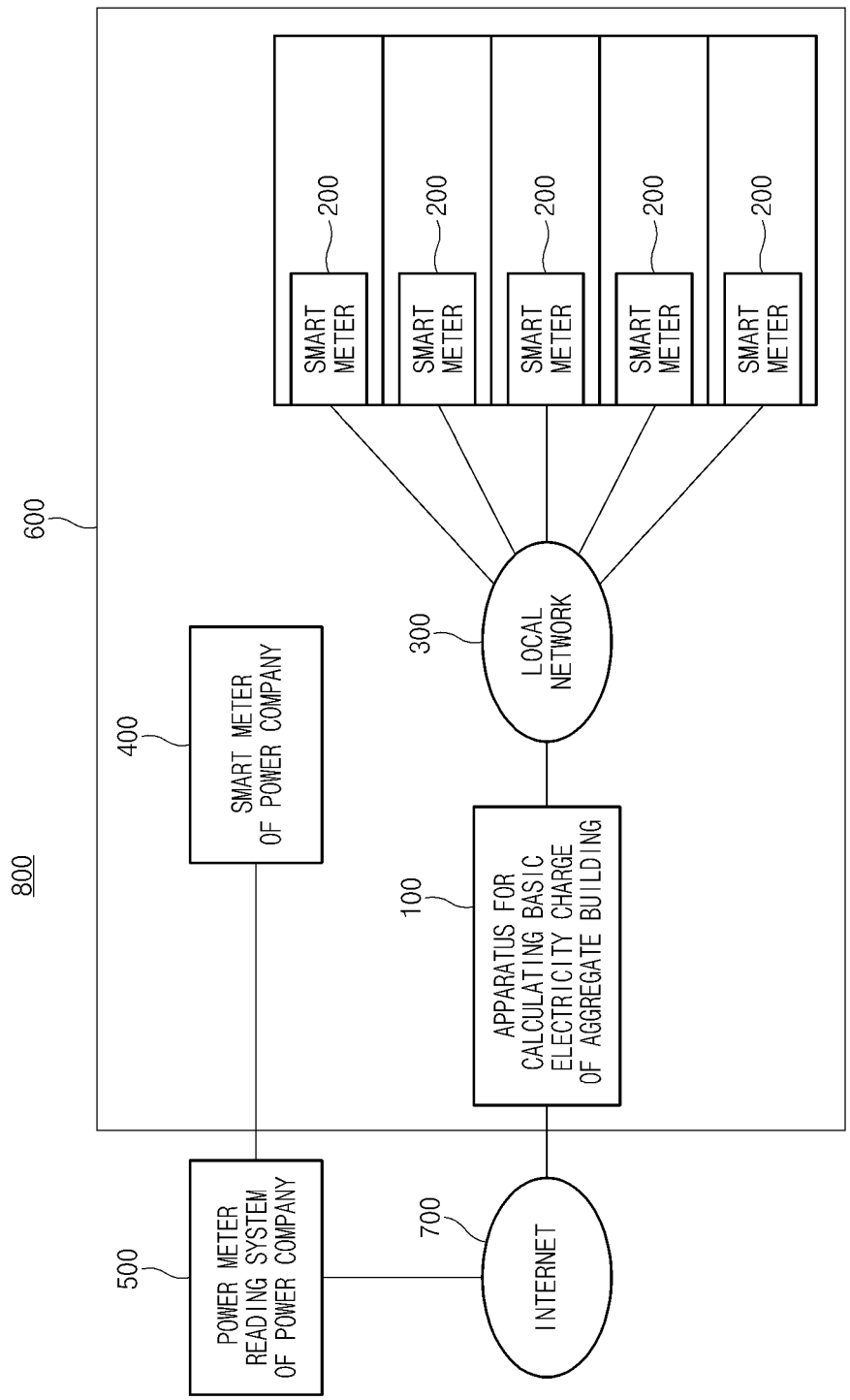
FIG. 1 is a diagram illustrating a configuration of a power operation system including an apparatus for calculating the basic electricity charge of an aggregate building according to an embodiment of the present invention.

Exemplary embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

Prior to a detailed description of the present invention, terms and words used in the specification and the claims shall not be interpreted as commonly-used dictionary meanings, but shall be interpreted as to be relevant to the technical scope of the invention based on the fact that the inventor may property define the concept of the terms to explain the invention in best ways. Therefore, the embodiments and the configurations depicted in the drawings are illustrative purposes only and do not represent all technical scopes of the embodiments, so it should be understood that various equivalents and modifications may exist at the time of filing this application. Some constituent elements shown in the drawings may be exaggerated, omitted or schematically drawn for the purpose of convenience or clarity.

FIG. 1 is a diagram illustrating a configuration of a power operation system 800 including an apparatus 100 for calculating the basic electricity charge of an aggregate building according to an embodiment of the present invention.

Referring to FIG. 1, the power operation system 800 according to an embodiment of the present invention may include devices 100 to 400 installed in an aggregate building 600 and a power meter reading system 500 of a power company which are interworked on a network 700 such as Internet. The aggregate building 600 may include the apparatus 100 for calculating the basic electricity charge of an aggregate building and smart meters 200 for each household (or partitioned owner) which are interworked with the apparatus 100 for calculating the basic electricity charge of an aggregate building via a local network (or Customer Premises Network) 300 such as Internet in the aggregate building 600, Wi-Fi, mobile network, dedicated network, and the like, and furthermore, may include a smart meter 400 of a power company which can be interworked with the power meter reading system 500 of a power company via a communication network 700 such as Internet, or the dedicated network.

The power meter reading system 500 of a power company may receive electricity usage information of the entire aggregate building 600 for an electricity charging period such as monthly, yearly, etc from the smart meter 400 of a power company which is installed in the aggregate building 600 and which measures the electricity consumption consumed by the entire aggregate building 600, manage electricity usage information for each aggregate building in a storage means such as memory, etc, and generate information on electricity charging for each aggregate building including the basic electricity charge together with a relevant electricity charge. The power company may collect the charging from the administrator or the owner of each aggregate building according to the information on electricity charging for each aggregate building. The information on electricity charging may include information on the basic electricity charge and the electricity usage charge which are divided and charged with respect to the entire aggregate building, and the management firm or the administrator of the aggregate building may calculate the basic electricity charge and the electricity usage charge for each resident household in the aggregate building and may impose and collect the charges from users.

The smart meter 200 for each household may measure the electricity usage which is consumed for each household (or each partitioned owner) of the aggregate building 600, may periodically provide information on electricity usage for each household to the apparatus 100 for calculating the basic electricity charge of an aggregate building, and may provide information on electricity usage for each household periodically or on a certain day and the like according to the request of the apparatus 100 for calculating the basic electricity charge of an aggregate building. Here, the (resident) household (or the partitioned owner) of the aggregate building 600 may correspond to a person that is the target of electricity charges collection. The household (or the partitioned owner) may differ for each floor, and furthermore, the household (or the partitioned owner) may be separated into multiple households (or the partitioned owners) in the same floor.

The apparatus 100 for calculating the basic electricity charge of an aggregate building may collect the information on electricity usage for each household of an aggregate building from the smart meter 200 for each household via the local network 300 and may store and manage in the storage means such as memory, calculate maximum demand power for each household for an electricity charging period such as monthly or yearly using the collected electricity usage information for each household, and then, automatically calculate the basic electricity charges for each household with respect to the basic electricity charges of an entire aggregate building in consideration of the calculated maximum demand power for each household obtained and a ratio of ownership shares for each household based on the ownership shares for each household.

The apparatus 100 for calculating the basic electricity charge of an aggregate building may receive information on electricity usage for an entire aggregate building 600 and information on basic electricity charge imposed on the aggregate building from the power meter reading system 500 of a power company via the communication network 700, and may calculate the basic electricity charge for each household based on the received information. The information on electricity usage for an entire aggregate building 600 and the information on basic electricity charge imposed on the aggregate building, and the like may be notified to the administrator, or the like through offline, and accordingly, corresponding information may be input through a user interface of the apparatus 100 for calculating the basic electricity charge of an aggregate building.

FIG. 2 is a block diagram illustrating an apparatus 100 for calculating the basic electricity charge of an aggregate building according to an embodiment of the present invention. Here, it is illustrated with reference to a flowchart of FIG. 3.

Referring to FIG. 2, the apparatus 100 for calculating the basic electricity charge of an aggregate building according to an embodiment of the present invention may include a network connection unit 110, an aggregate building basic information input unit 120, an electricity usage collection unit 130, an electricity usage/basic electricity charge storage unit 140, a basic electricity charge computation unit 150, and a power information/basic electricity charge information output unit 160.

The network connection unit 110 may perform a connection setting for connecting to the local network 300, receive electricity usage information for each household from the smart meter 200 for each household periodically, or may transmit certain request information to the smart meter 200 for each household periodically or on a certain day so that the electricity usage information for each household may be received and processed from the smart meter 200 for each household.

Figure 3:
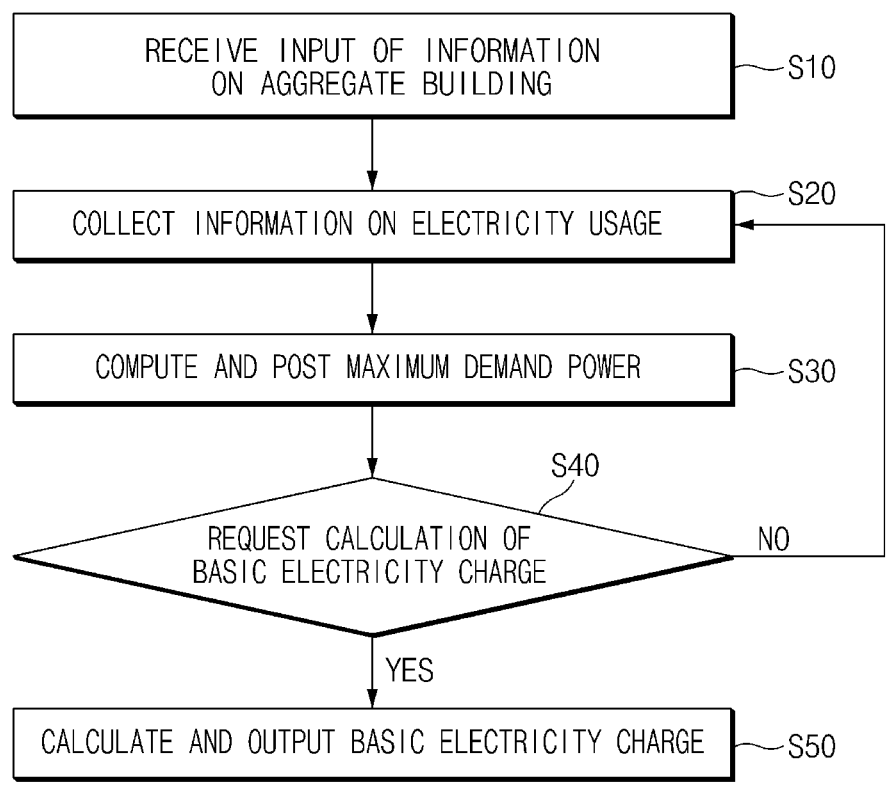
FIG. 3 is a flowchart illustrating an operation of an apparatus for calculating the basic electricity charge according to an embodiment of the present invention.

The aggregate building basic information input unit 120 may receive an input of information on a ratio of ownership shares of partitioned ownership for each household and the basic electricity charge (or the contract demand with a power company) for a certain electricity charging period (e.g., monthly, yearly, etc) of the entire aggregate building imposed by the power company, from the administrator or the like through a user interface and store the information in the storage means such as memory (refer to S10 in FIG. 3).

The electricity usage collection unit 130 may periodically collect information on electricity usage for each household from the smart meter 200 for each household via the network connection unit 110, or may transmit certain request information via the network connection unit 110 in a preset time (e.g., periodically or on a certain day, or the like) so that the electricity usage information for each household may be collected from the smart meter 200 for each household (refer to S20 in FIG. 3). In addition, the electricity usage collection unit 130 may collect information on electricity usage for the entire aggregate building 600 for the electricity charging period from the power meter reading system 500 of a power company.

The electricity usage/basic electricity charge storage unit 140 may store the information on electricity usage for each household collected by the electricity usage collection unit 130 in the storage means such as memory, compute the largest value among average power value for each collection time slot (e.g., time, day, etc) with respect to a certain electricity charging period from the information on electricity usage for each household and store the calculated largest value, as the maximum demand power for each household, in the storage means such as memory, and also store information on basic electricity charge for each household calculated as in the below by the basic electricity charge computation unit 150 (refer to S30 in FIG. 3). The electricity usage/basic electricity charge storage unit 140 may post variously the above information on the maximum demand power for each household, the basic electricity charge for each household, and the like to the partitioned owners of each household. For example, the electricity usage/basic electricity charge storage unit 140 may post the information to display on a certain display unit through a user interface, or the electricity usage/basic electricity charge storage unit 140 may provide the information to the power meter reading system 500 of a power company via the network connection unit 110, and the partitioned owners of each household may access to a web server or the like provided by the power meter reading system 500 of a power company through the Internet and check the information.

According to the information of a ratio of ownership shares of partitioned ownership for each household and the basic electricity charge of the entire aggregate building imposed by the power company for the electricity charging period, and information on electricity usage for the entire aggregate building 600, when it is time for charging (e.g., monthly, yearly, etc), the administrator of the aggregate building may request the calculation of the basic electricity charge for each household through a user interface, in order to collect the basic electricity charge from the partitioned owner for each household (refer to S40 in FIG. 3).

Accordingly, the basic electricity charge computation unit 150 may calculate the basic electricity charge for each household with respect to a certain period such as monthly or yearly so that information on the basic electricity charge for the entire aggregate building which is imposed by the power company according to the maximum demand power for each household and the ratio of ownership shares of partitioned ownership for each household may be appropriately distributed according to the request for the calculation, and the power information/basic electricity charge information output unit 160 may output the information on (or contract demand) the basic electricity charge for the entire aggregate building which is imposed by the power company, information on power such as the maximum demand power, the information on the basic electricity charge for the entire aggregate building, the basic electricity charge for each household, and the electricity usage information for the entire aggregate building 600, so that the above information may be posted variously to the partitioned owners of each household (refer to S50 of FIG. 3). For example, the power information/basic electricity charge information output unit 160 may post the above information so that the above information may be displayed on a certain display device through the user interface, or the power information/basic electricity charge information output unit 160 may provide the above information to the power meter reading system 500 of a power company via the network connection unit 110, and the partitioned owners of each household may access and check the web server or the like provided by the power meter reading system 500 of a power company through the Internet.

On the other hand, the basic electricity charge computation unit 150 may compute the basic electricity charge for each household of step S50 by using Equation to Equation 4, according to the electricity usage information for each household and the ratio of ownership shares for each household.

First, the basic electricity charge computation unit 150 may compute an electricity usage of integrated household (I_EU) by summing (n=natural number) the electricity usage (EUi) for each household measured by the smart meter 200 as shown in Equation 1. In addition, the basic electricity charge computation unit 150 may compute a difference between the electricity usage (T_EU) for the entire aggregate building 600 measured by the smart meter 400 of a power company and the electricity usage of integrated household (I_EU) so that a common electricity usage (P_EU) for the entire aggregate building may be computed.

$$I\_EU = \sum_{j}^{n} EU_j, \ P\_EU = T\_EU - I\_EU \quad \text{[Equation 1]}$$

Next, as expressed in below Equation 2, the basic electricity charge computation unit 150 may compute a common basic electricity charge (P_EBR) by using the common electricity usage (P_EU), the electricity usage (T_EU) for the entire aggregate building 600, and the basic electricity charge (T_EBR) of the entire aggregate building imposed by the power company, and may compute the basic electricity charge (I_EBR) of the integrated household by computing a difference between the basic electricity charge (T_EBR) of the entire aggregate building and the common basic electricity charge (P_EBR). That is, the basic electricity charge computation unit 150 may compute the basic electricity charge (I_EBR) of the integrated household by deducting the common basic electricity charge (P_EBR) computed from the basic electricity charge (T_EBR) of the entire aggregate building according to the ratio of the electricity usage (T_EU) for the entire aggregate building to the common electricity usage (P_EU), from the basic electricity charge (T_EBR) of the entire aggregate building.

$$P\_EBR = \frac{P\_EU}{T\_EU} \times T\_EBR, \ I\_EBR = T\_EBR - P\_EBR \quad \text{[Equation 2]}$$

Next, as expressed in below Equation 3, the basic electricity charge computation unit 150 may compute the basic electricity charge (EBRi) for each household (i) by using the maximum demand power (MDPi) for each household (i) obtained in the step (S30) of computing a maximum demand power and the ratio (SOi) of ownership shares for each household (i). As expressed in below Equation 3, the basic electricity charge (EBRi) for each household (i) may be computed by summing up a value obtained by distributing the basic electricity charge (I_EBR) of the integrated household to each household according to the ratio of a total sum of the maximum demand power (MDPi) for each household (i) to the maximum demand power (MDPi) for each household (i), and a value obtained by distributing the common basic electricity charge (P_EBR) to each household according to the ratio of a total sum of the ratio (SOi) of ownership shares for each household (i) to the ratio (SOi) of ownership shares for each household (i).

$$EBR_i = \frac{MDP_i}{\sum_{k=1}^{n} MDP_k} \times I\_EBR + \frac{SO_i}{\sum_{i=1}^{n} SO_i} \times P\_EBR \quad \text{[Equation 3]}$$

In addition, the basic electricity charge computation unit 150 may compute the basic electricity charge (EBRi) for each household (i) as expressed in below Equation 4.

That is, the basic electricity charge computation unit 150 may compute the basic electricity charge (EBRi) for each household (i) by summing up a value obtained by distributing the basic electricity charge (I_EBR) of the integrated household to each household according to the ratio of the electricity usage of integrated household (I_EU) to the electricity usage (EUi) for each household, and a value obtained by distributing the common basic electricity charge (P_EBR) to each household according to the ratio of the total sum of the ratio (SOi) of ownership shares for each household (i) to the ratio (SOi) of ownership shares for each household (i).

$$EBR_i = \frac{EU_i}{I\_EU} \times I\_EBR + \frac{SO_i}{\sum_{l=1}^{n} SO_k} \times P\_EBR \quad \text{[Equation 4]}$$

Figure 4:
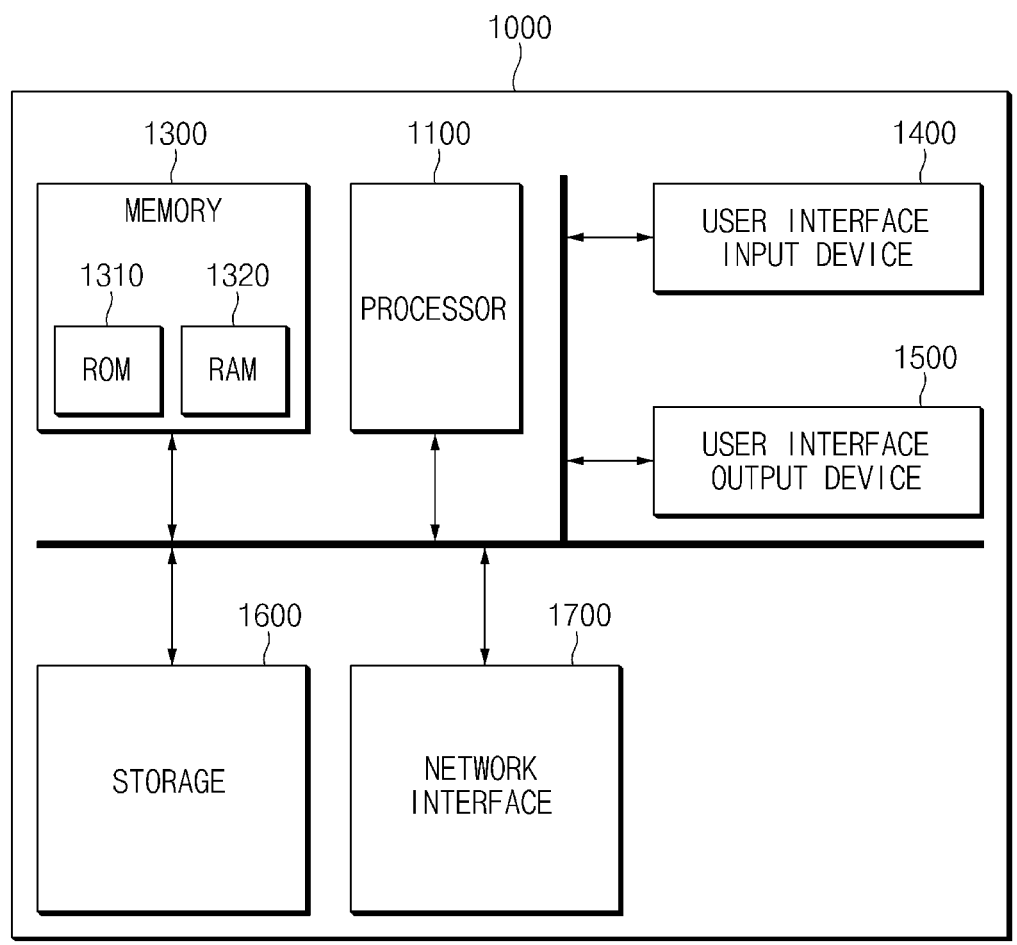
FIG. 4 is a diagram illustrating an example of a configuration of an apparatus 100 for calculating the basic electricity charge according to an embodiment of the present invention.

FIG. 4 is a diagram illustrating an example of a configuration of an apparatus 100 for calculating the basic electricity charge according to an embodiment of the present invention. That is, the apparatus 100 for calculating the basic electricity charge according to an embodiment of the present invention may be implemented by hardware, software, or a combination of the two. For example, the apparatus 100 for calculating the basic electricity charge may be implemented by a computing system 1000 as shown in FIG. 4.

The computing system 1000 may include at least one processor 1100 which is connected through a bus 1200, a memory 1300, a user interface input device 1400, a user interface output device 1500, a storage 1600, and a network interface 1700. The processor 1100 may be a semiconductor device that executes the processing for the instructions stored in a central processing unit (CPU) or the memory 1300 and/or the storage 1600. The memory 1300 and the storage 1600 may include various types of volatile or nonvolatile storage media. For example, the memory 1300 may include a Read Only Memory (ROM) 1310 and a Random Access Memory (RAM) 1320.

Accordingly, the above mentioned method or the steps of an algorithm related to the embodiments disclosed in the present invention may be directly implemented by a hardware, a software module, or a combination of the two executed by a processor. The software module may reside in a storage medium, that is, in the memory 1300 and/or the storage 1600 such as a RAM memory, a flash memory, a ROM memory, an EPROM memory, an EEPROM memory, a register, a hard disk, a removable disk, and CD-ROM. The exemplary storage medium may be coupled to the processor 1100, and the processor 1100 may read information from the storage medium and write information to the storage medium. Alternatively, the storage medium may be integrated in the processor 1100. The processor and the storage medium may reside in an application specific integrated circuit (ASIC). The ASIC may reside in a user terminal. Alternatively, the processor and the storage medium may reside in the user terminal as an individual component.

As described above, the apparatus 100 for automatically calculating basic electricity charges according to the present invention are capable of periodically collecting electricity usage information for each household by using a smart meter 200 provided in an aggregate building 600 in which power reception equipment is installed, calculating the monthly or yearly maximum demand power for each household using the collected electricity usage information, and then, automatically calculating the basic electricity charges for each household with respect to the basic electricity charges of an entire aggregate building in consideration of the calculated maximum demand power for each household obtained and a ratio of ownership shares for each household based on the ownership shares for each resident household, and healing dissensions caused by the existing unreasonable calculation of the basic electricity charge, and inducing partitioned owners or residents of the aggregate building to minimize the power consumption by reflecting the maximum demand power for each household on the calculation of the basic electricity charge, thereby managing the use of the power so that the entire basic electricity charge of the aggregate building and the electricity charges for each household may be reduced.

Although exemplary embodiments of the present invention have been described in detail hereinabove, it should be clearly understood that many variations and modifications of the basic inventive concepts herein taught which may appear to those skilled in the present art will still fall within the spirit and scope of the present invention, as defined in the appended claims.

What is claimed is:

1. An apparatus for calculating basic electricity charges for partitioned owners in an aggregate building, the apparatus comprising:
   one or more processors that process computer executable program code embodied in non-transitory computer readable storage media, the computer executable program code comprising:
   basic information input program code that receives a ratio of ownership shares for each household and an entire basic electricity charge of the aggregate building for an electricity charging period through a user interface;
   electricity usage collection program code that collects information on electricity usage for each household from a smart meter for each household which measures electricity usage for each household of the aggregate building via a local network inside of the aggregate building, that collects information on electricity usage for an entire aggregate building for the electricity charging period from a power meter reading system of a power company via an outside network, and that stores the collected information in a storage means; and
   basic electricity charge computation program code that calculates a basic electricity charge for each household, according to a formula, by using the information of the storage means so that a basic electricity charge for the entire aggregate building may be distributed to each household which is imposed for the electricity charging period by the power company, according to the information on electricity usage for each household and the ratio of ownership shares for each household, according to a request for calculation,
   wherein the electricity usage collection program code collects the information on electricity usage for each household which is periodically transmitted by the smart meter for each household, and
   wherein the formula comprises:

$$EBR_i = \frac{EU_i}{I\_EU} \times I\_EBR + \frac{SO_i}{\sum_{l=1}^{n} SO_l} \times P\_EBR$$

EBRi being basic electricity charge, i being each household;
EUi being electricity usage for each household;

I_EU being electricity usage of integrated household;
I_EBR being basic electricity charge of the integrated household;
SOi being ownership shares for each household i, n being a natural number;
P_EBR being common basic electricity charge to each household.

2. The apparatus of claim 1, wherein the electricity usage collection program code collects the information on electricity usage for each household from the smart meter for each household by transmitting request information to the smart meter for each household in a preset time.

3. The apparatus of claim 1 further comprising:
storage program code that calculates the largest value among average power value for each collection time slot from the information on electricity usage for each household and stores the calculated largest value as a maximum demand power for each household in the storage means,
wherein the basic electricity charge computation program code calculates the basic electricity charge for each household by reflecting a value obtained by distributing a basic electricity charge of an integrated household to each household according to a ratio of a total sum of the maximum demand power for each household to the maximum demand power for each household, based on the information on electricity usage for each household.

4. The apparatus of claim 1, wherein the basic electricity charge computation program code calculates the basic electricity charge for each household by reflecting a value obtained by distributing a basic electricity charge of an integrated household to each household according to a ratio of an electricity usage of integrated household to an electricity usage for each household, based on the information on electricity usage for each household.

5. The apparatus of claim 1, wherein the basic electricity charge computation program code calculates the basic electricity charge for each household by reflecting a value obtained by distributing a common basic electricity charge to each household according to a ratio of a total sum of the ratio of ownership shares for each household to the ratio of ownership shares for each household, based on the ratio of ownership shares for each household.

6. A method for calculating basic electricity charges for partitioned owners in an aggregate building, the method comprising:
processing computer executable program code embodied in non-transitory computer readable storage media by one or more processors;
executing by the one or more processors, program code that receives a ratio of ownership shares for each household and an entire basic electricity charge of the aggregate building for an electricity charging period through a user interface;
executing by the one or more processors, program code that collects information on electricity usage for each household from a smart meter for each household which measures electricity usage for each household of the aggregate building via a local network inside of the aggregate building,
executing by the one or more processors, program code that collects information on electricity usage for an entire aggregate building for the electricity charging period from a power meter reading system of a power company via an outside network, and stores the collected information in a storage means; and
executing by the one or more processors, program code that calculates a basic electricity charge for each household, according to a formula, by using the information of the storage means so that a basic electricity charge for the entire aggregate building may be distributed to each household which is imposed for the electricity charging period by the power company, according to the information on electricity usage for each household and the ratio of ownership shares for each household, according to a request for calculation,
wherein the program code that collects information on electricity usage for each household comprises program code, executed by the one or more processors, that collects the information on electricity usage for each household which is periodically transmitted by the smart meter for each household, and
wherein the formula comprises:

$$EBR_i = \frac{EU_i}{I\_EU} \times I\_EBR + \frac{SO_i}{\sum_{l=1}^{n} SO_l} \times P\_EBR$$

EBRi being basic electricity charge, i being each household;
EUi being electricity usage for each household;
I_EU being electricity usage of integrated household;
I_EBR being basic electricity charge of the integrated household;
SOi being ownership shares for each household i, n being a natural number;
P_EBR being common basic electricity charge to each household.

7. The method of claim 6, wherein the program code that collects information on electricity usage for each household comprises program code, executed by the one or more processors, that collects the information on electricity usage for each household from the smart meter for each household by transmitting request information to the smart meter for each household in a preset time.

8. The method of claim 6, further comprising executing, by the one or more processors, program code that calculates the largest value among average power value for each collection time slot from the information on electricity usage for each household and that stores the calculated largest value as a maximum demand power for each household in the storage means,
wherein the program code that calculates a basic electricity charge for each household comprises program code, executed by the one or more processors, that calculates the basic electricity charge for each household by reflecting a value obtained by distributing a basic electricity charge of an integrated household to each household according to a ratio of a total sum of the maximum demand power for each household to the maximum demand power for each household, based on the information on electricity usage for each household.

9. The method of claim 6, wherein the program code that calculates a basic electricity charge for each household comprises program code, executed by the one or more processors, that calculates the basic electricity charge for each household by reflecting a value obtained by distributing a basic electricity charge of an integrated household to each household according to a ratio of an electricity usage of integrated household to an electricity usage for each household, based on the information on electricity usage for each household.

10. The method of claim 6, wherein the program code that calculates a basic electricity charge for each household comprises program code, executed by the one or more processors, that calculates the basic electricity charge for each household by reflecting a value obtained by distributing a common basic electricity charge to each household according to a ratio of a total sum of the ratio of ownership shares for each household to the ratio of ownership shares for each household, based on the ratio of ownership shares for each household.

11. A system for calculating basic electricity charges in an aggregate building in association with a power meter reading system of a power company on a network, the system comprising:
- a smart meter of a power company configured to provide information on electricity usage for an entire aggregate building for an electricity charging period to the power meter reading system of the power company;
- a smart meter for each household configured to measure electricity usage consumed in each household of the aggregate building and periodically provide information on electricity usage for each household; and
- an apparatus for calculating basic electricity charges in an aggregate building configured to collect the information on electricity usage for each household via a local network inside of the aggregate building, collect information on electricity usage for an entire aggregate building for the electricity charging period from the power meter reading system of the power company via an outside network, and store the collected information in a storage means,
- wherein the apparatus for calculating basic electricity charges in an aggregate building comprises one or more processors that process computer executable program code embodied in non-transitory computer readable storage media, the computer executable program code comprising:
- program code that receives a ratio of ownership shares for each household and an entire basic electricity charge of the aggregate building for the electricity charging period through a user interface, and that calculates a basic electricity charge for each household, according to a formula, by using the information of the storage means so that a basic electricity charge for the entire aggregate building may be distributed to each household, according to the information on electricity usage for each household and a ratio of ownership shares for each household, according to a request for calculation, and
- wherein the formula comprises:

$$EBR_i = \frac{EU_i}{I\_EU} \times I\_EBR + \frac{SO_i}{\sum_{l=1}^{n} SO_l} \times P\_EBR$$

EBRi being basic electricity charge, i being each household;
EUi being electricity usage for each household;
I_EU being electricity usage of integrated household;
I_EBR being basic electricity charge of the integrated household;
SOi being ownership shares for each household i, n being a natural number;
P_EBR being common basic electricity charge to each household.

* * * * *